United States Patent
Takeno (10) Patent No.: US 9,530,702 B2
(45) Date of Patent: Dec. 27, 2016

(54) METHOD FOR MEASURING RECOMBINATION LIFETIME OF SILICON SUBSTRATE

(71) Applicant: SHIN-ETSU HANDOTAI CO., LTD., Tokyo (JP)

(72) Inventor: Hiroshi Takeno, Gunma (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 14/764,856

(22) PCT Filed: Dec. 27, 2013

(86) PCT No.: PCT/JP2013/085065
§ 371 (c)(1),
(2) Date: Jul. 30, 2015

(87) PCT Pub. No.: WO2014/125751
PCT Pub. Date: Aug. 21, 2014

(65) Prior Publication Data
US 2016/0005664 A1    Jan. 7, 2016

(30) Foreign Application Priority Data

Feb. 15, 2013  (JP) .................................. 2013-027242

(51) Int. Cl.
*G01R 31/26*  (2014.01)
*H01L 21/66*  (2006.01)
(Continued)

(52) U.S. Cl.
CPC ........... *H01L 22/14* (2013.01); *G01R 31/2642* (2013.01); *G01R 1/00* (2013.01); *G01R 3/00* (2013.01);
(Continued)

(58) Field of Classification Search
CPC ....................................................... H01L 22/14
(Continued)

(56) References Cited

U.S. PATENT DOCUMENTS

| 5,327,195 A  * | 7/1994 | Ehr ................. G01N 27/44721 |
| | | 355/113 |
| 5,760,597 A | 6/1998 | Yoshida et al. |
| 8,008,929 B2 * | 8/2011 | Allibert .............. G01R 31/2648 |
| | | 250/339.06 |

FOREIGN PATENT DOCUMENTS

| JP | H08-335618 A | 12/1996 |
| JP | 2000-183123 A | 6/2000 |

(Continued)

OTHER PUBLICATIONS

McKelvey "Experimental Determination of Injected Carrier Recombination Rates at Dislocations in Semiconductors", Physical Review, vol. 106, No. 5, Jun. 1951.*

(Continued)

*Primary Examiner* — Xinning Niu
*Assistant Examiner* — Vu A Vu
(74) *Attorney, Agent, or Firm* — Michael Best & Friedrich LLP (57) ABSTRACT

Provided is a method of measuring a recombination lifetime of a silicon substrate, which is capable of evaluating metal contamination and crystal defects in a silicon substrate manufacturing process and a device manufacturing process with high accuracy. The method includes: measuring a recombination lifetime of a silicon substrate after subjecting a surface of the silicon substrate to chemical passivation processing; and performing ultraviolet protection processing of protecting at least the silicon substrate from ultraviolet rays during a period from the chemical passivation processing to a time when the measurement of the recombination lifetime is completed.

3 Claims, 6 Drawing Sheets

(51) Int. Cl.
*G01R 33/48* (2006.01)
*G01R 1/00* (2006.01)
*G01R 3/00* (2006.01)
*G01R 33/565* (2006.01)

(52) U.S. Cl.
CPC ..... *G01R 33/4828* (2013.01); *G01R 33/56527* (2013.01)

(58) Field of Classification Search
USPC .......................................................... 438/17
See application file for complete search history.

(56) References Cited

FOREIGN PATENT DOCUMENTS

| | | |
|---|---|---|
| JP | 2002-329692 A | 11/2002 |
| JP | 2007-048959 A | 2/2007 |
| JP | 2010-192809 A | 9/2010 |
| JP | 2010-539678 A | 12/2010 |
| WO | WO-2009/033629 A1 | 3/2009 |

OTHER PUBLICATIONS

Horanyi, T.S., et al., "In Situ Bulk Lifetime Measurement on Silicon With a Chemically Passivated Surface" Jul. 31, 1992, Applied Surface Science 63, pp. 306-311, Elsevier Science Publishers B.V.
JEIDA Standard, "A Recombination Lifetime Measurement Method by the Reflection Microwave Light Conductive Decrement Method of the Silicon Wafer" Apr. 1997, Japan Electronic Industry Development Association.
Takato, Hidetaka, et al., "Quinhydrone/Methanol Treatment for the Measurement of Carrier Lifetime in Silicon Substrates" Aug. 1, 2002, Japan Journal of Applied Physics vol. 4, pp. L870-L872, The Japan Society of Applied Physics.
International Search Report issued for corresponding International Application No. PCT/JP2013/085065.
Japanese Office Action issued Jun. 2, 2016 for corresponding Japanese Application No. 2013-027242.

\* cited by examiner

METHOD FOR MEASURING RECOMBINATION LIFETIME OF SILICON SUBSTRATE

TECHNICAL FIELD

The present invention relates to a method of measuring a recombination lifetime of a silicon substrate with high accuracy in order to evaluate metal contamination and crystal defects in a silicon substrate manufacturing process or a device manufacturing process.

BACKGROUND ART

As a method of evaluating metal contamination in a silicon substrate manufacturing process or a device manufacturing process, the measurement of a recombination lifetime by a microwave photoconductivity decay method (μ-PCD method) has been widely used. According to the μ-PCD method, a wafer is first irradiated with pulses of light having energy larger than that of a bandgap of a silicon single crystal to generate excess carriers in the wafer. The generated excess carriers increase the conductivity of the wafer, and thereafter the excess carriers disappear with time due to the recombination, with the result that the conductivity decreases. This change is detected as a change with time in reflected microwave power and analyzed so that a recombination lifetime can be determined. The recombination lifetime becomes shorter when metal impurities and defects forming a level to be a recombination center in a forbidden band are present. Therefore, the metal impurities, crystal defects, and the like in the wafer can be evaluated by measuring the recombination lifetime (for example, Non Patent Document 1).

In the case where a sample to be evaluated has a wafer shape, the excess carriers generated by the pulses of light not only disappear due to the recombination in the wafer but also diffuse to a front surface and a back surface of the wafer to disappear due to the surface recombination. Thus, in order to evaluate metal contamination and crystal defects in the wafer, it is necessary to suppress the surface recombination on the front surface and the back surface. As a method of suppressing the surface recombination, heat oxidation treatment (oxidation film passivation) and electrolyte solution treatment (chemical passivation processing, sometimes abbreviated as "CP processing") have been generally used. In the oxidation film passivation, care needs to be taken so as not to cause metal contamination and crystal defects in a heat treatment step for forming an oxidation film. Therefore, in the case of evaluating metal contamination in heat treatment furnaces other than an oxidation furnace, for example, an epitaxial growth furnace for manufacturing an epitaxial wafer, the chemical passivation processing is used.

As a solution for the chemical passivation processing, an alcoholic iodine solution (for example, Non Patent Document 2) and an alcoholic quinhydrone solution (for example, Patent Document 1) are known. In the case of the alcoholic quinhydrone solution, it takes time for surface passivation effects to be stabilized (for example, Non Patent Document 3). Therefore, in the case where it is desired to obtain evaluation results of metal contamination as fast as possible, the alcoholic iodine solution is used.

However, in the chemical passivation processing using the alcoholic iodine solution, there is a problem in that a measurement value decreases with time after the processing, and hence the measurement value varies. In order to solve this problem, in Patent Document 2, there is disclosed a method of correcting a measurement value through use of a correction formula that expresses a correction value for correcting a change with time in a measurement value as a function of time. However, this method has a problem in that it is necessary to measure a change with time in a recombination lifetime, and hence it takes time and labor.

Along with an increase in performance of a semiconductor device, even a small amount of metal contamination has an adverse effect on the performance of the device, and hence it has become a crucial issue to reduce metal contamination. In particular, in imaging elements such as a charge-coupled device (CCD) and a CMOS image sensor (CIS), a faint white flaw, a dark current, and the like become problems along with the enhancement of light-receiving sensitivity and resolution, and there is a risk in that a slight amount of metal contamination may have an adverse effect on the imaging elements. Therefore, in an epitaxial wafer used widely as a substrate for an imaging element, it is strongly desired to reduce not only metal contamination in a device manufacturing process but also metal contamination in a process of manufacturing the epitaxial wafer.

In order to reduce metal contamination in the silicon substrate manufacturing process or the device manufacturing process, a method of evaluating a slight amount of metal contamination with high sensitivity and high accuracy is required. Further, whether or not products are to be manufactured depends on results obtained by evaluating metal contamination, and hence it is required that evaluation results be obtained as fast as possible.

PRIOR ART DOCUMENTS

Patent Document

Patent Document 1: JP 2002-329692 A
Patent Document 2: JP 2010-192809 A

Non Patent Document

Non Patent Document 1: JEIDA-53-1997 "Test method for recombination lifetime in silicon wafers by measurement of photoconductivity decay by microwave reflectance"
Non Patent Document 2: T. S. Horanyi et al., Appl. Surf. Sci. 63(1993) 306.
Non Patent Document 3: H. Takato et al., Jpn. J. Appl. Phys. 41(2002) L870.

SUMMARY OF THE INVENTION

Problems to be Solved by the Invention

The present invention has been made in view of the above-mentioned related-art problems, and it is an object of the present invention to provide a method of measuring a recombination lifetime of a silicon substrate, which is capable of evaluating metal contamination and crystal defects in a silicon substrate manufacturing process and a device manufacturing process with high accuracy.

Means for Solving Problems

In order to solve the above-mentioned problems, a method of measuring a recombination lifetime of a silicon substrate according to the present invention includes: measuring a recombination lifetime of a silicon substrate after subjecting a surface of the silicon substrate to chemical passivation processing; and performing ultraviolet protection processing of protecting at least the silicon substrate from ultraviolet rays during a period from the chemical passivation processing to a time when the measurement of the recombination lifetime is completed.

As described above, when at least the silicon substrate is subjected to the ultraviolet protecting processing of protecting the silicon substrate from ultraviolet rays during a period from the chemical passivation processing to a time when the measurement of the recombination lifetime is completed, a change with time in a measurement value immediately after the chemical passivation processing may be reduced, and hence the recombination lifetime may be measured with high accuracy.

In this case, the ultraviolet protection processing may be performed by performing the chemical passivation processing to the measurement of the recombination lifetime in a light-shielded environment. For example, in the light-shielded environment such as a dark room, the silicon substrate may be protected from ultraviolet rays, and hence a change with time in a measurement value immediately after the chemical passivation processing may be reduced, and the recombination lifetime may be measured with high accuracy.

Further, it is preferred that the ultraviolet protection processing be performed by performing the chemical passivation processing to the measurement of the recombination lifetime in an environment in which ultraviolet rays are cut. The environment in which ultraviolet rays are cut herein includes an environment in which ultraviolet rays are reduced, as well as an environment in which ultraviolet rays are removed or an environment in which ultraviolet rays are blocked. For example, in an environment in which ultraviolet rays are cut such as a yellow room, the silicon substrate may be protected from ultraviolet rays, and hence a change with time in a measurement value immediately after the chemical passivation processing may be reduced to the same degree as that in the case of the light-shielded environment, and the recombination lifetime may be measured with high accuracy.

Further, the chemical passivation processing may be performed by storing the silicon substrate in a bag or a container made of a synthetic resin of a material that cuts ultraviolet rays to immerse the silicon substrate in a solution for chemical passivation, to thereby measure the recombination lifetime.

As described above, when the silicon substrate is stored in the bag or the container made of the synthetic resin of the material that cuts the ultraviolet rays, the chemical passivation processing and the measurement of the recombination lifetime may be performed under the same condition as that of the environment in which the ultraviolet rays are cut. Therefore, a change with time in a measurement value immediately after the chemical passivation processing may be reduced to the same degree as that in the case of the light-shielded environment, and the recombination lifetime may be measured with high accuracy. As the synthetic resin, polyethylene or polypropylene may be used. Further, as the bag or the container made of the synthetic resin of the material that cuts the ultraviolet rays, a commercially available bag or container made of a synthetic resin of a type that cuts ultraviolet rays may be used.

Further, it is preferred that the chemical passivation processing be performed through use of an alcoholic iodine solution.

As described above, the chemical passivation processing using the alcoholic iodine solution has a high passivation effect and allows the passivation effect to be stabilized quickly after the processing, and hence the recombination lifetime may be measured quickly.

Further, it is preferred that the recombination lifetime be measured by a microwave photoconductivity decay method ($\mu$-PCD method). With the $\mu$-PCD method, the recombination lifetime of the silicon substrate subjected to the chemical passivation may be measured easily.

Advantageous Effects of the Invention

According to the method of measuring a recombination lifetime of a silicon substrate of the present invention, the change with time in the measurement value after the chemical passivation processing can be reduced, and hence the recombination lifetime can be measured with high accuracy. With this, in the silicon substrate manufacturing process or the device manufacturing process, metal contamination can be evaluated quickly with high sensitivity and high accuracy.

MODES FOR CARRYING OUT THE INVENTION

In measurement of a recombination lifetime of a silicon substrate, in the case of chemical passivation using an alcoholic iodine solution, which has been used widely for surface passivation processing, a dangling bond on a surface of the silicon substrate is first terminated with iodine, and at this time, a measurement value of the recombination lifetime becomes maximum. After that, along with the elapse of time, iodine at the terminal is eliminated to be substituted by an alkoxy group due to the nucleophilic substitution reaction by the alkoxy group in the solution. It is considered that the surface passivation effect is weakened in a process of this chemical reaction so that the measurement value decreases. The inventor of the present invention found that light influences the speed of the chemical reaction, and the chemical reaction is suppressed by shielding light to reduce a change with time in the measurement value. Further, the inventor of the present invention found that, by cutting ultraviolet rays having a short wavelength in the light, a change with time in the measurement value can be reduced to the same degree as that in the case of shielding light, thereby achieving the present invention.

Now, an embodiment of the present invention is specifically described, but the present invention is not limited thereto.

First, a silicon substrate to be evaluated is prepared. There is no particular limitation on a method of preparing the silicon substrate in the present invention. For example, in the case where it is desired to evaluate metal contamination and crystal defects in a growth step of a silicon single crystal, a silicon substrate to be evaluated can be prepared by cutting a wafer from the silicon single crystal and subjecting the cut wafer to chemical etching so as to remove damage caused by the cutting. Further, in the case where it is desired to evaluate metal contamination in an epitaxial growth furnace, a silicon substrate to be evaluated can be prepared by growing an epitaxial layer on a silicon substrate in the epitaxial growth furnace. Alternatively, a silicon substrate to be evaluated can also be prepared by subjecting a silicon substrate to only heat treatment without growing an epitaxial layer on the silicon substrate.

In the case where a natural oxidation film is formed on a surface of the prepared silicon substrate, the natural oxidation film is removed with a hydrofluoric acid solution before chemical passivation processing.

Next, in order to suppress the surface recombination of the silicon substrate, the silicon substrate is subjected to chemical passivation processing in an environment in which the silicon substrate is protected from ultraviolet rays. The chemical passivation processing can be performed through use of an alcoholic iodine solution, for example, an iodine-ethanol solution. Subsequently, in an environment in which the silicon substrate subjected to the chemical passivation processing is protected from ultraviolet rays, a recombination lifetime is measured. The recombination lifetime can be measured by a microwave photoconductivity decay method (μ-PCD method). As a measurement condition in the μ-PCD method, a generally used condition may be adopted, and the recombination lifetime can be measured, for example, under a condition described in Non Patent Document 1. As a measurement device, a commercially available one can be used.

Thus, when the chemical passivation processing to the measurement of the recombination lifetime are performed in the environment in which the silicon substrate is protected from ultraviolet rays, a change with time in a measurement value immediately after the chemical passivation processing can be reduced, and the recombination lifetime can be measured with high accuracy.

In order to protect the silicon substrate from ultraviolet rays, the chemical passivation processing to the measurement of the recombination lifetime can be performed in a light-shielded environment. As the light-shielded environment, for example, the entire room may be shielded from light or only an operation region may be shielded from light.

Further, in order to protect the silicon substrate from ultraviolet rays, the chemical passivation processing to the measurement of the recombination lifetime can be performed in an environment in which ultraviolet rays are cut. As the environment in which ultraviolet rays are cut, for example, a yellow room can be used. It is extremely difficult to perform an operation in the light-shielded environment, and it is easier to perform an operation in the environment in which ultraviolet rays are cut, and hence the environment in which ultraviolet rays are cut is more preferred.

Further, in order to protect the silicon substrate from ultraviolet rays, the silicon substrate is stored in a bag or a container made of a synthetic resin of a material that cuts ultraviolet rays, and a solution for chemical passivation is injected into the bag or the container to perform the chemical passivation processing. Thus, the recombination lifetime can be measured. As the synthetic resin, polyethylene or polypropylene can be used.

As described above, by storing the silicon substrate in the bag or the container made of the synthetic resin of the material that cuts ultraviolet rays, the chemical passivation processing and the measurement of the recombination lifetime can be performed easily without the necessity of newly preparing a dark room, a yellow room, or the like.

EXAMPLES

Hereinafter, the present invention is described in more detail by way of Examples and Comparative Examples. However, the present invention is not limited thereto.

Example 1

A silicon single crystal ingot having a conductivity type of a P type, a resistivity of about 10 Ω·cm, and an oxygen concentration of about 15 ppma (JEITA) was grown by a Czochralski method. The diameter of the silicon single crystal ingot is 200 mm, and the crystal axis orientation thereof is <100>. Then, a mirror-finished silicon substrate was manufactured from the silicon single crystal ingot by a standard wafer manufacturing process.

Next, a natural oxidation film on the manufactured silicon substrate was removed with a hydrofluoric acid solution, and thereafter the silicon substrate was subjected to chemical passivation processing using an iodine-ethanol solution in a light-shielded dark box. In this case, the chemical passivation processing was performed by storing the silicon substrate in the same transparent polyethylene bag (thickness: about 0.1 mm) having a high ultraviolet transmittance as that of Comparative Example 1 described later and injecting an iodine-ethanol solution into the polyethylene bag. Then, a recombination lifetime was measured by a μ-PCD method in a light-shielded device. For measuring the recombination lifetime, a lifetime measurement device "WT-2000" manufactured by Semilab Co. Ltd. was used. A pulse laser for exciting carriers was set to have a wavelength of 904 nm, a pulse width of 200 ns, a carrier injection amount of 1.2E13/cm$^2$, and a microwave frequency of about 10 GHz. In order to check a change with time in a measurement value of the recombination lifetime, the measurement was performed repeatedly at any time interval. While the measurement was performed repeatedly, the silicon substrate was held in the light-shielded device. Further, the transparent polyethylene bag was measured for a light transmittance with a spectrophotometer (Hitachi spectrophotometer "U-3000").

Figure 1:
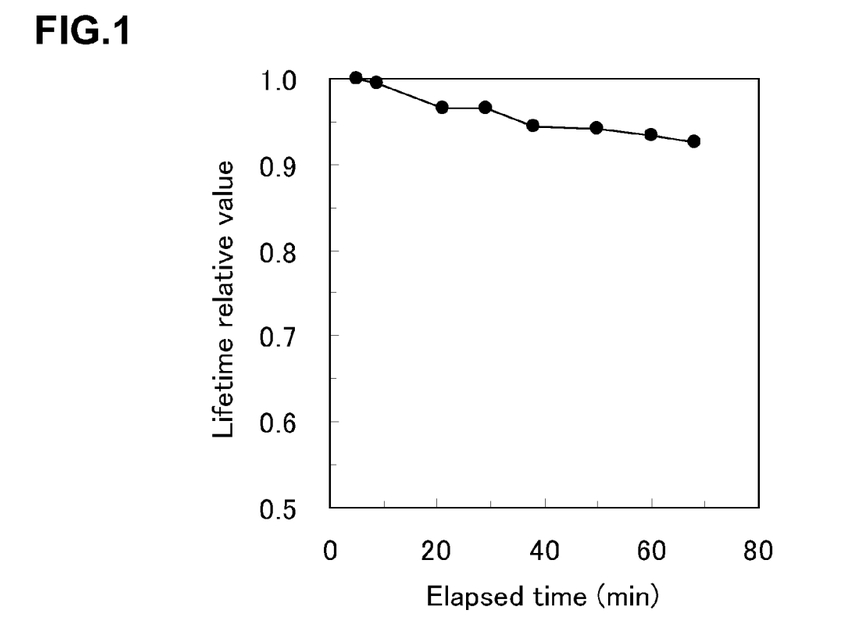
FIG. 1 is a graph for showing a relationship between an elapsed time after chemical passivation processing and a recombination lifetime relative value in Example 1.
Figure 2:
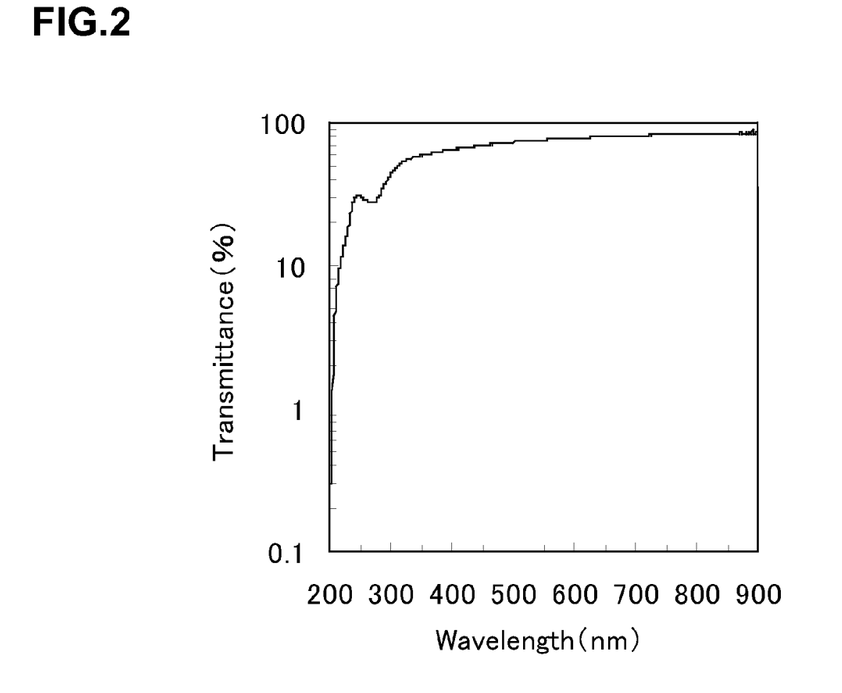
FIG. 2 is a graph for showing a relationship between a wavelength and a transmittance of light of a polyethylene bag in Example 1.

The measurement results of the recombination lifetime are shown in FIG. 1. In a graph of FIG. 1, the horizontal axis represents an elapsed time after the chemical passivation processing, and the vertical axis represents a relative value of a measurement value in the case where an initial recombination lifetime measurement value is assumed to be 1. The absolute value of the initial measurement value is about 1,800 μsec, which is also applied to Examples 2 and 3 and Comparative Examples 1 and 2 described later. Further, the measurement results of a light transmittance are shown in FIG. 2. In a graph of FIG. 2, the horizontal axis represents a light wavelength, and the vertical axis represents a light transmittance.

As shown in FIG. 1, a decrease in the measurement value at an elapsed time of 60 minutes after the chemical passivation processing was within 10%. Further, as shown in FIG. 2, the transparent polyethylene bag used in this example had a light transmittance of several tens of % at a wavelength of about 400 nm or less, which was higher than that of a UV-cut polyethylene bag used in Example 2 described later. It is understood from those results that a change with time in the measurement value can be reduced compared to the case of the comparative examples described later by performing the chemical passivation processing to the measurement of the recombination lifetime in a light-shielded environment.

Example 2

A silicon substrate manufactured from the same silicon single crystal ingot as that of Example 1 was prepared.

Next, a natural oxidation film on the prepared silicon substrate was removed with a hydrofluoric acid solution. After that, the silicon substrate was stored in a commercially available UV-cut polyethylene bag (semi-transparent brown, thickness: about 0.1 mm, manufactured by Aso Co., Ltd.), and an iodine-ethanol solution was injected into the UV-cut polyethylene bag. Thus, the silicon substrate was subjected to chemical passivation processing. Then, a recombination lifetime was measured by a μ-PCD method in a light-shielded device. The measurement condition of the recombination lifetime is the same as that of Example 1. In order to check a change with time in a measurement value of the recombination lifetime, the measurement was performed repeatedly at any time interval. While the chemical passivation processing was performed and the measurement was performed repeatedly, the UV-cut polyethylene bag was placed under a fluorescent lamp of about 400 lx. Further, the UV-cut polyethylene bag was measured for a light transmittance with a spectrophotometer.

Figure 3:
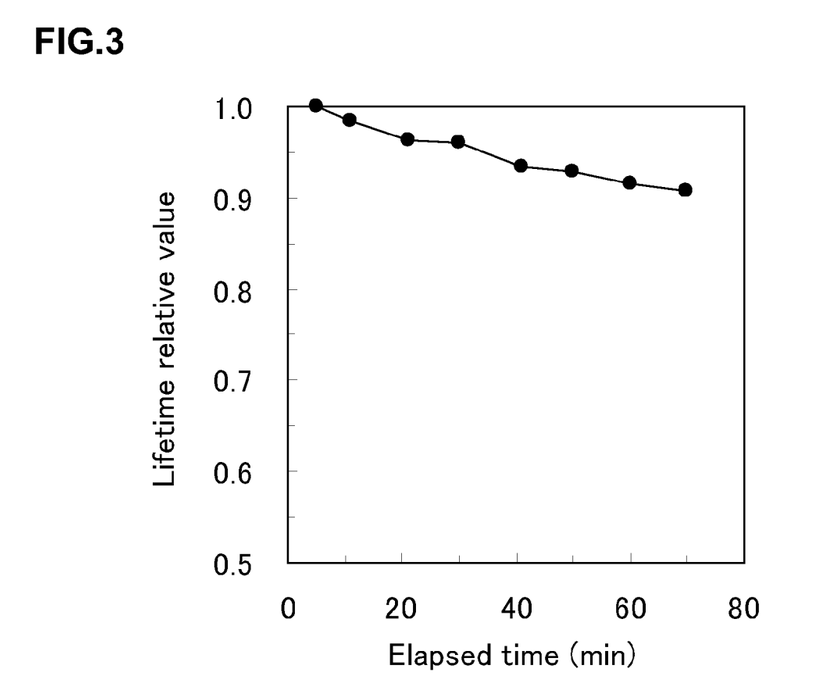
FIG. 3 is a graph for showing a relationship between an elapsed time after chemical passivation processing and a recombination lifetime relative value in Example 2.
Figure 4:
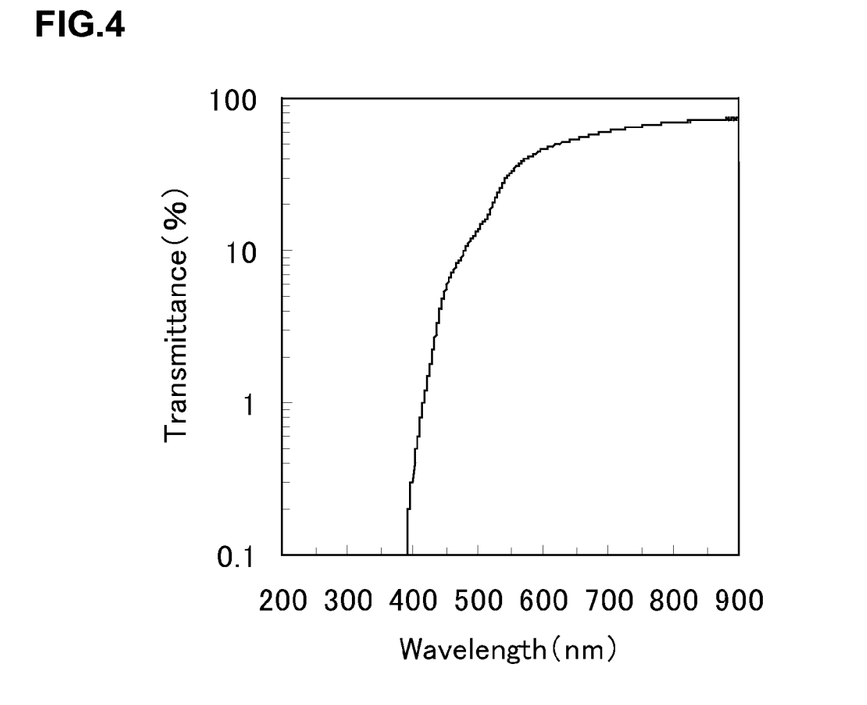
FIG. 4 is a graph for showing a relationship between a wavelength and a transmittance of light of a UV-cut polyethylene bag in Example 2.

The measurement results of the recombination lifetime are shown in FIG. 3. In a graph of FIG. 3, the horizontal axis represents an elapsed time after the chemical passivation processing, and the vertical axis represents a relative value of a measurement value in the case where an initial recombination lifetime measurement value is assumed to be 1. Further, the measurement results of a light transmittance are shown in FIG. 4. In a graph of FIG. 4, the horizontal axis represents a light wavelength, and the vertical axis represents a light transmittance.

As shown in FIG. 3, a decrease in the measurement value at an elapsed time of 60 minutes after the chemical passivation processing was within 10%. Further, as shown in FIG. 4, the UV-cut polyethylene bag used in this example had a light transmittance of less than 0.1% at a wavelength of about 400 nm or less.

It is understood from those results that a change with time in the measurement value can be reduced to the same degree as that in the case of shielding light in Example 1 by storing the silicon substrate in the polyethylene bag of the material that cuts ultraviolet rays and performing the chemical passivation processing, followed by measuring the recombination lifetime.

Example 3

A silicon substrate manufactured from the same silicon single crystal ingot as that of Example 1 was prepared.

Next, a natural oxidation film on the prepared silicon substrate was removed with a hydrofluoric acid solution. After that, the silicon substrate was stored in the same transparent polyethylene bag having a high ultraviolet transmittance as that of Example 1, and the polyethylene bag was covered with a mylar film (semi-transparent yellow). Then, an iodine-ethanol solution was injected into the polyethylene bag. Thus, the silicon substrate was subjected to chemical passivation processing. Then, a recombination lifetime was measured by a μ-PCD method in a light-shielded device. The measurement condition of the recombination lifetime is the same as that of Example 1. In order to check a change with time in a measurement value of the recombination lifetime, the measurement was performed repeatedly at any time interval. While the chemical passivation processing was performed and the measurement was performed repeatedly, the transparent polyethylene bag with the mylar film was placed under a fluorescent lamp of about 400 lx. Further, the mylar film was measured for a light transmittance with a spectrophotometer.

Figure 5:
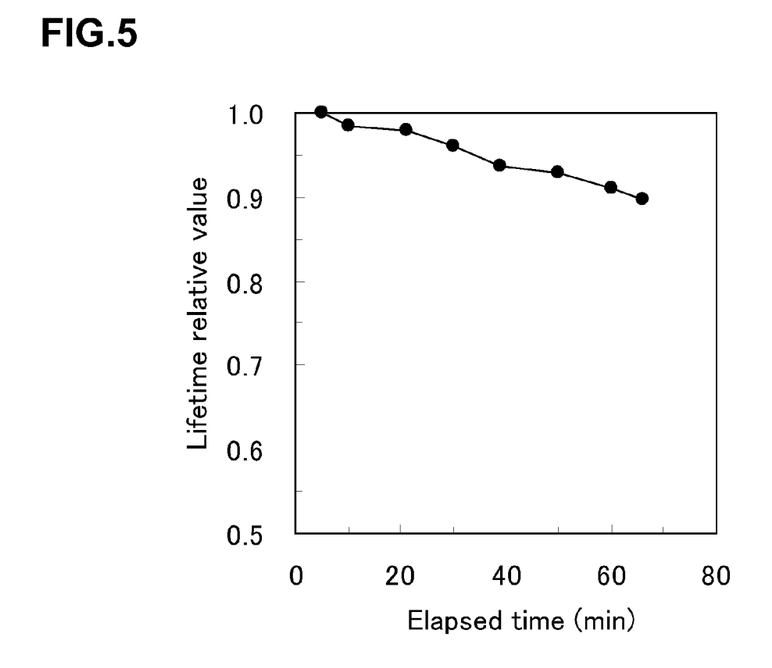
FIG. 5 is a graph for showing a relationship between an elapsed time after chemical passivation processing and a recombination lifetime relative value in Example 3.
Figure 6:
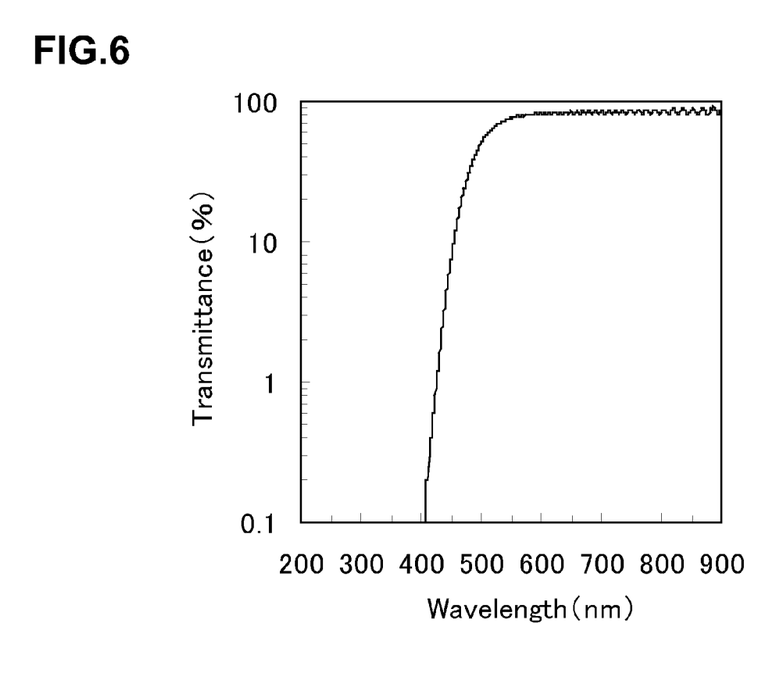
FIG. 6 is a graph for showing a relationship between a wavelength and a transmittance of light of a mylar film in Example 3.

The measurement results of the recombination lifetime are shown in FIG. 5. In a graph of FIG. 5, the horizontal axis represents an elapsed time after the chemical passivation processing, and the vertical axis represents a relative value of a measurement value in the case where an initial recombination lifetime measurement value is assumed to be 1. Further, the measurement results of a light transmittance are shown in FIG. 6. In a graph of FIG. 6, the horizontal axis represents a light wavelength, and the vertical axis represents a light transmittance.

As shown in FIG. 5, a decrease in the measurement value at an elapsed time of 60 minutes after the chemical passivation processing was within 10%. Further, as shown in FIG. 6, the mylar film used in this example had a light transmittance of less than 0.1% at a wavelength of about 400 nm or less. That is, the silicon substrate resulted in being protected from ultraviolet rays by covering the transparent polyethylene bag having a high ultraviolet transmittance with the mylar film having a low ultraviolet transmittance.

It is understood from those results that a change with time in the measurement value can be reduced to the same degree as that in the case of shielding light in Example 1 by performing the chemical passivation processing in a state in which the silicon substrate is protected from ultraviolet rays, followed by measuring the recombination lifetime.

Comparative Example 1

A silicon substrate manufactured from the same silicon single crystal ingot as that of Example 1 was prepared.

Next, a natural oxidation film on the prepared silicon substrate was removed with a hydrofluoric acid solution. After that, the silicon substrate was subjected to chemical passivation processing through use of an iodine-ethanol solution under a fluorescent lamp of about 400 lx. In this case, the chemical passivation processing was performed by storing the silicon substrate in the same transparent polyethylene bag having a high ultraviolet transmittance as that of Example 1 and injecting an iodine-ethanol solution into the transparent polyethylene bag. Then, a recombination lifetime was measured by a μ-PCD method in a light-shielded device. The measurement condition of the recombination lifetime is the same as that of Example 1. In order to check a change with time in a measurement value of the recombination lifetime, the measurement was performed repeatedly at any time interval. While the measurement was performed repeatedly, the transparent polyethylene bag was placed under a fluorescent lamp of about 400 lx.

Figure 7:
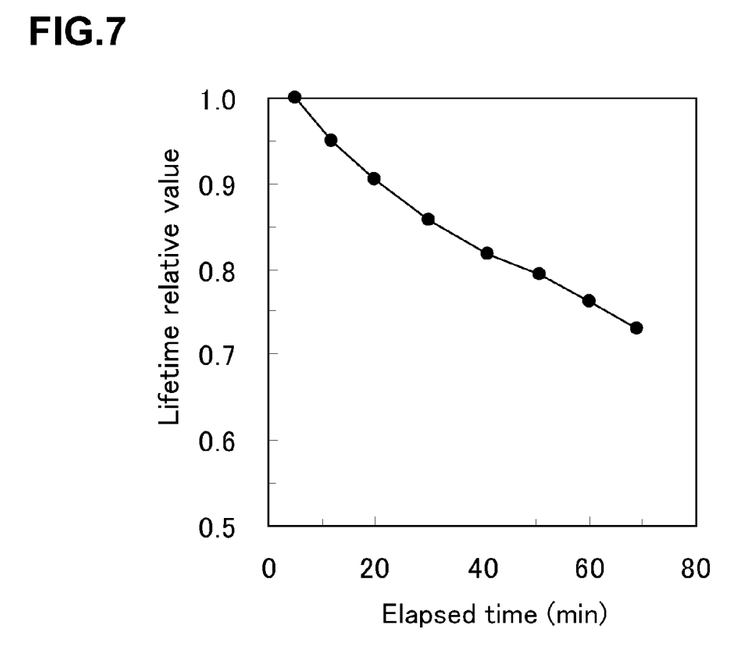
FIG. 7 is a graph for showing a relationship between an elapsed time after chemical passivation processing and a recombination lifetime relative value in Comparative Example 1.

The measurement results of the recombination lifetime are shown in FIG. 7. In a graph of FIG. 7, the horizontal axis represents an elapsed time after the chemical passivation processing, and the vertical axis represents a relative value of a measurement value in the case where an initial recombination lifetime measurement value is assumed to be 1.

As shown in FIG. 7, a decrease in the measurement value at an elapsed time of 60 minutes after the chemical passivation processing was about 25%, and thus it is understood that a change with time in the measurement value is larger than that in the case of Examples 1 to 3. The transparent polyethylene bag used in this comparative example has a light transmittance as shown in FIG. 2 and has a light transmittance of several tens of % at a wavelength of about 400 nm or less.

Comparative Example 2

A silicon substrate manufactured from the same silicon single crystal ingot as that of Example 1 was prepared.

Next, a natural oxidation film on the prepared silicon substrate was removed with a hydrofluoric acid solution. After that, the silicon substrate was subjected to chemical passivation processing through use of an iodine-ethanol solution under a fluorescent lamp of about 400 lx. In this case, the chemical passivation processing was performed by storing the silicon substrate in a transparent polyethylene terephthalate (PET, thickness: about 0.03 mm) bag having a high ultraviolet transmittance and injecting an iodine-ethanol solution into the polyethylene terephthalate bag. Then, a recombination lifetime was measured by a μ-PCD method in a light-shielded device. In order to check a change with time in a measurement value of the recombination lifetime, the measurement was performed repeatedly at any time interval. While the measurement was performed repeatedly, the polyethylene terephthalate bag was placed under a fluorescent lamp of about 400 lx. Further, the transparent PET bag was measured for a light transmittance with a spectrophotometer.

Figure 8:
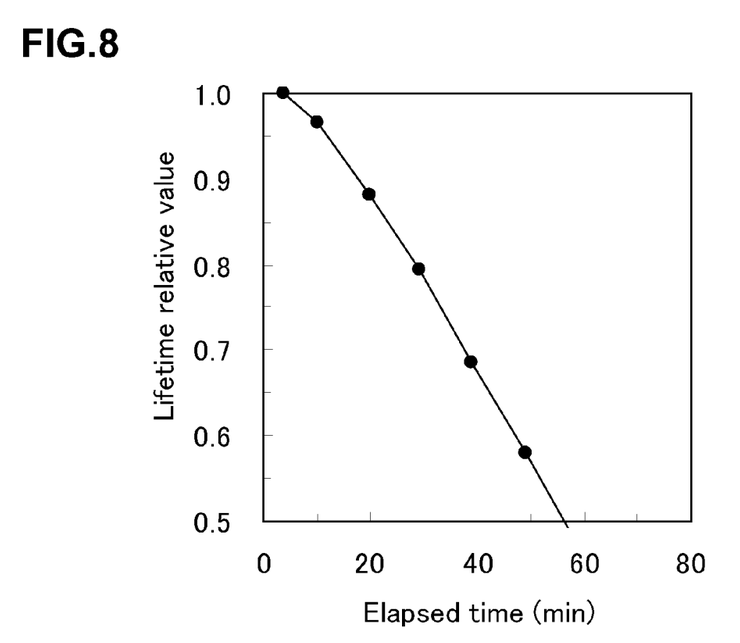
FIG. 8 is a graph for showing a relationship between an elapsed time after chemical passivation processing and a recombination lifetime relative value in Comparative Example 2.
Figure 9:
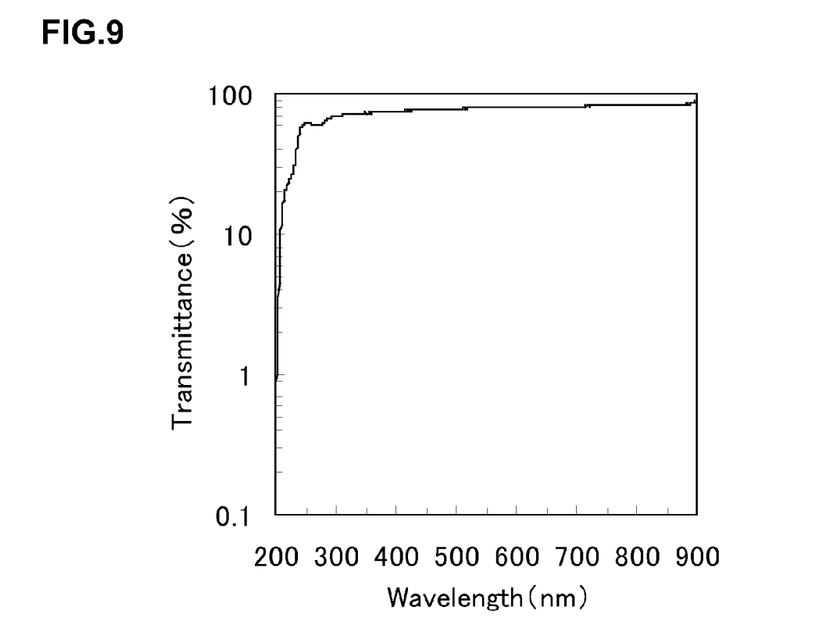
FIG. 9 is a graph for showing a relationship between a wavelength and a transmittance of light of a polyethylene terephthalate bag in Comparative Example 2.

The measurement results of the recombination lifetime are shown in FIG. 8. In a graph of FIG. 8, the horizontal axis represents an elapsed time after the chemical passivation processing, and the vertical axis represents a relative value of a measurement value in the case where an initial recombination lifetime measurement value is assumed to be 1. Further, the measurement results of a light transmittance are shown in FIG. 9. In a graph of FIG. 9, the horizontal axis represents a light wavelength, and the vertical axis represents a light transmittance.

As shown in FIG. 8, a decrease in the measurement value at an elapsed time of 60 minutes after the chemical passivation processing was about 50% or more, and thus it is understood that a change with time in the measurement value is larger than that in the case of Examples 1 to 3. Further, as shown in FIG. 9, the transparent PET bag used in this comparative example had a light transmittance of about 70% at a wavelength of about 400 nm or less, which was higher than that of Comparative Example 1. It is understood from those results that, when the light transmittance at a wavelength of about 400 nm or less becomes high, a change with time in the measurement value increases.

Example 4

A silicon single crystal ingot having a conductivity type of a P type, a resistivity of about 60 Ω·cm, and an oxygen concentration of about 10 ppma (JEITA) was grown by a Czochralski method. The diameter of the silicon single crystal ingot is 200 mm, and the crystal axis orientation thereof is <100>. Then, a mirror-finished silicon substrate was manufactured from the silicon single crystal ingot by a standard wafer manufacturing process.

Next, a natural oxidation film on the prepared silicon substrate was removed with a hydrofluoric acid solution. After that, the silicon substrate was stored in the same UV-cut polyethylene bag as that of Example 2, and an iodine-ethanol solution was injected into the UV-cut polyethylene bag. Thus, the silicon substrate was subjected to chemical passivation processing. Then, a recombination lifetime was measured by a μ-PCD method in a light-shielded device. The measurement condition of the recombination lifetime is the same as that of Example 1. In order to check a change with time in a measurement value of the recombination lifetime, the measurement was performed repeatedly at any time interval. While the chemical passivation processing was performed and the measurement was performed repeatedly, the UV-cut polyethylene bag was placed under a fluorescent lamp of about 400 lx.

Figure 10:
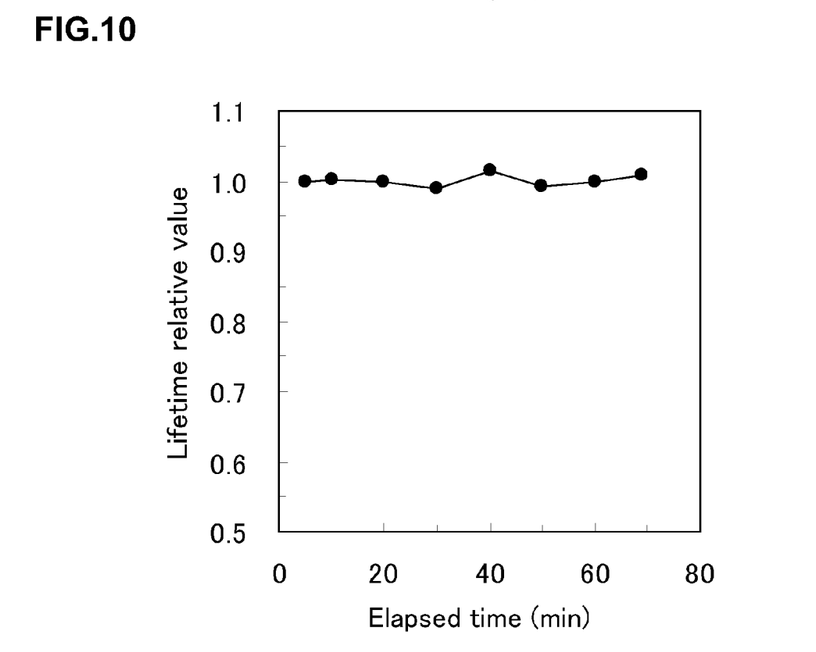
FIG. 10 is a graph for showing a relationship between an elapsed time after chemical passivation processing and a recombination lifetime relative value in Example 4.

Measurement results of the recombination lifetime are shown in FIG. 10. In a graph of FIG. 10, the horizontal axis represents an elapsed time after the chemical passivation processing, and the vertical axis represents a relative value of a measurement value in the case where an initial recombination lifetime measurement value is assumed to be 1. The absolute value of the initial measurement value is about 4,200 μsec, which is also applied to Comparative Example 3 described later.

As shown in FIG. 10, the measurement value hardly decreased even at an elapsed time of 60 minutes after the chemical passivation processing. It is considered that a change with time in the measurement value was smaller than that of Example 2 because of the high resistivity of the silicon substrate. It is understood from those results that a change with time in the measurement value can be reduced compared to that of Comparative Example 3 described later by storing the silicon substrate in the polyethylene bag of the material that cuts ultraviolet rays and performing the chemical passivation processing, followed by measuring the recombination lifetime.

Comparative Example 3

A silicon substrate manufactured from the same silicon single crystal ingot as that of Example 4 was prepared.

Next, a natural oxidation film on the prepared silicon substrate was removed with a hydrofluoric acid solution. After that the silicon substrate was subjected to chemical passivation processing using an iodine-ethanol solution under a fluorescent lamp of about 400 lx. In this case, the chemical passivation was performed by storing the silicon substrate in the same transparent polyethylene bag having a high ultraviolet transmittance as that of Example 1 and injecting an iodine-ethanol solution into the transparent polyethylene bag. Then, a recombination lifetime was measured by a μ-PCD method in a light-shielded device. The measurement condition of the recombination lifetime is the same as that of Example 1. In order to check a change with time in a measurement value of the recombination lifetime, the measurement was performed repeatedly at any time interval. While the measurement was performed repeatedly, the transparent polyethylene bag was placed under a fluorescent lamp of about 400 lx.

Figure 11:
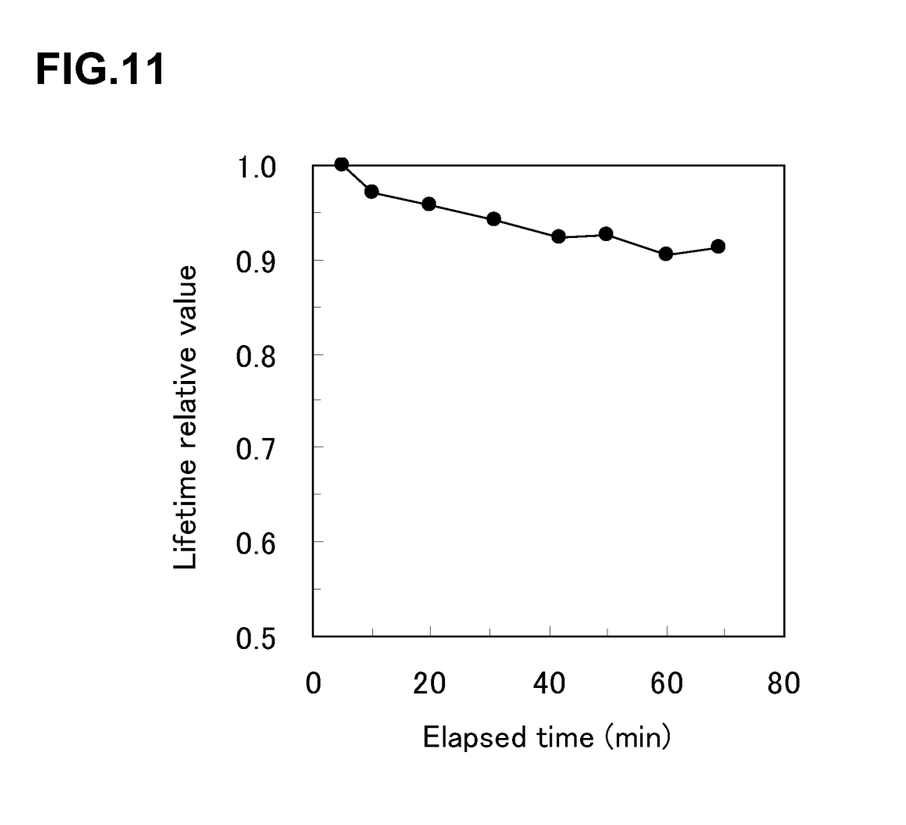
FIG. 11 is a graph for showing a relationship between an elapsed time after chemical passivation processing and a recombination lifetime relative value in Comparative Example 3.

The measurement results of the recombination lifetime are shown in FIG. 11. In a graph of FIG. 11, the horizontal axis represents an elapsed time after the chemical passivation processing, and the vertical axis represents a relative value of a measurement value in the case where an initial recombination lifetime measurement value is assumed to be 1.

As shown in FIG. 11, a decrease in the measurement value at an elapsed time of 60 minutes after the chemical passivation processing was about 10%, and thus it is understood that a change with time in the measurement value is larger than that in the case of Example 4. The transparent polyethylene bag used in this comparative example has a light transmittance as shown in FIG. 2 and has a light transmittance of several tens of % at a wavelength of about 400 nm or less.

It was found from the above-mentioned results of the examples and the comparative examples that, according to the present invention, a change with time in the measurement value of the recombination lifetime after the chemical passivation can be reduced, and the recombination lifetime can be measured with high accuracy.

Note that, the present invention is not limited to the embodiment described above. The embodiment is given only for illustrative purposes, and any other embodiment that has a configuration substantially the same as the technical concept described in the claims of the present invention and exhibits similar actions and effects is included in the technical scope of the present invention.

The invention claimed is:

1. A method of measuring a recombination lifetime of a silicon substrate, the method comprising:
   measuring a recombination lifetime of a silicon substrate after subjecting a surface of the silicon substrate to chemical passivation processing; and
   performing ultraviolet protection processing of protecting at least the silicon substrate from ultraviolet rays during a period from the chemical passivation processing to a time when the measurement of the recombination lifetime is completed,
   wherein the chemical passivation processing is performed by inserting the silicon substrate in a bag or a container made of a synthetic resin of a material that cuts ultraviolet rays to immerse the silicon substrate in a solution for chemical passivation, to thereby measure the recombination lifetime.

2. A method of measuring a recombination lifetime of a silicon substrate according to claim 1, wherein the chemical passivation processing is performed through use of an alcoholic iodine solution.

3. A method of measuring a recombination lifetime of a silicon substrate according to claim 1, wherein the recombination lifetime is measured by a microwave photoconductivity decay method.

* * * * *